US005620829A

United States Patent [19]
Deprez

[11] Patent Number: 5,620,829
[45] Date of Patent: Apr. 15, 1997

[54] METHOD FOR MAKING A LITHOGRAPHIC PRINTING PLATE ACCORDING TO THE SILVER SALT DIFFUSION TRANSFER PROCESS

[75] Inventor: Lode Deprez, Wachtebeke, Belgium

[73] Assignee: Agfa-Gevaert, N.V., Mortsel, Belgium

[21] Appl. No.: 495,075

[22] Filed: Jun. 27, 1995

Related U.S. Application Data

[63] Continuation-in-part of Ser. No. 252,118, May 31, 1994, abandoned.

[30] Foreign Application Priority Data

Jun. 15, 1993 [EP] European Pat. Off. .............. 93201713

[51] Int. Cl.$^6$ .............................. G03C 8/06; G03C 8/32; G03F 7/07
[52] U.S. Cl. .................... 430/204; 430/230; 430/234; 430/251
[58] Field of Search .................................. 430/204, 251, 430/230, 234

[56] References Cited

U.S. PATENT DOCUMENTS

| | | | |
|---|---|---|---|
| 5,108,871 | 4/1992 | Yamano et al. | 430/204 |
| 5,200,294 | 4/1993 | De Keyzer et al. | 430/204 |
| 5,283,156 | 2/1994 | Monbaliu et al. | 430/204 |
| 5,387,483 | 2/1995 | Takagi | 430/204 |
| 5,472,822 | 12/1995 | Hayashi | 430/204 |

FOREIGN PATENT DOCUMENTS

| | | | |
|---|---|---|---|
| 4-324448 | 11/1992 | Japan | 430/204 |
| 4-328559 | 11/1992 | Japan | 430/204 |

*Primary Examiner*—Richard L. Schilling
*Attorney, Agent, or Firm*—Breiner & Breiner

[57] ABSTRACT

The present invention provides a method for making a lithographic printing plate according to the silver salt diffusion transfer process comprising the steps of image-wise exposing an imaging element comprising on a support a photosensitive layer comprising silver halide emulsion(s) wherein less than 1 mole % of the silver halide is silver bromide and an image receiving layer containing physical development nuclei and developing said imaging element using an alkaline processing liquid with a pH lower than 11.5 in the presence of developing agent(s) and a meso-ionic compound.

7 Claims, No Drawings

METHOD FOR MAKING A LITHOGRAPHIC PRINTING PLATE ACCORDING TO THE SILVER SALT DIFFUSION TRANSFER PROCESS

This application is a continuation-in-part of application Ser. No. 08/252,118, filed May 31, 1994, now abandoned.

DESCRIPTION

1. Field of the Invention

The present invention relates to a method for making a lithographic printing plate according to the silver salt diffusion transfer process.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed in EP-A-423399 and EP-A-410500.

The DTR-image can be formed in the image-receiving layer of a sheet or web material which is a separate element with respect to the photographic silver halide emulsion material (a so-called two-sheet DTR element) or in the image-receiving layer of a so-called single-support element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

As for other printing plates it is required that the printing plates obtained according to the DTR-process have a high printing endurance, good ink acceptance in the printing areas and no ink acceptance in the non-printing areas (no staining). It is furthermore desirable that the number of copies that have to be disposed of because of ink acceptance in the non-printing areas (so called toning) during start-up of the printing process is limited. It is furthermore desirable that the printing properties of the plates obtained according To the DTR-process are not or only slightly influenced by the exhaustion degree of the processing solution so that a high number of printing plates of the required quality can be obtained in a small volume of processing solution. It is also desirable that printing plates with good printing properties can be obtained according to the DTR-process by applying a processing solution with a pH lower than 11.5. However the actual preferred alkaline processing solutions for preparing printing plates according to the DTR-process have a higher pH, mostly 13 or more. These solutions are however corrosive and deteriorate rapidly.

Meso-ionic compounds are well known in silver halide photography and are used in the preparation of a lithographic printing plate according to the DTR process for increasing the printing endurance and ink acceptance as disclosed in JP-Pi 04-328,559; 05-107,773 and EP-A-535,678. Triazolium thiolate meso-ionic compounds are used e.g. in a developer or a prebath for development acceleration as disclosed in EP-A-533,182 and in the preparation of a lithographic printing plate according to the DTR process for increasing the printing endurance and ink acceptance as disclosed in JP-Pi 04-324,448. However by making a lithographic printing plate according to the silver salt diffusion transfer process in the presence of a meso-ionic compound using an alkaline processing liquid with a pH<11.5, a rather limited number of printing plates can be produced before the printing properties of the plates deteriorate to an unacceptable level due to the exhaustion of the processing solution.

SUMMARY OF THE INVENTION

It is an object of the present invention to provide a method for making lithographic printing plates according to the DTR-process using an alkaline processing solution with a pH lower than 11.5 which printing properties are only slightly influenced by the exhaustion degree of the processing solution.

Further objects of the present invention will become clear from the description hereinafter.

According to the present invention there is provided a method for making a lithographic printing plate according to the silver salt diffusion transfer process comprising the steps of image-wise exposing an imaging element comprising on a support a photosensitive layer comprising silver halide emulsion(s) wherein less than 1 mole % of the silver halide is silver bromide and an image receiving layer containing physical development nuclei and developing said imaging element using an alkaline processing liquid with a pH lower than 11.5 in the presence of developing agent(s) and a meso-ionic compound.

According to the present invention there is also provided an imaging element for use in the above defined method.

DETAILED DESCRIPTION OF THE PRESENT INVENTION

According to the present invention it has been found that a lithographic printing plate prepared according to the DTR-process using an alkaline processing solution with a pH lower than 11.5 in the presence of meso-ionic compounds has good printing properties which are only slightly influenced by the exhaustion degree of the processing solution when less than 1 mole % of the silver halide comprised in the photosensitive layer is silver bromide.

If the fraction of silver bromide becomes more than 1% the printing properties worsen and the influence of the exhaustion degree of the processing solution increases.

The photosensitive layer used in accordance with the present invention can consist of any silver halide emulsion comprising a hydrophilic colloid binder, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

According to the present invention the emulsion or emulsions preferably consist principally of silver chloride while a fraction of silver bromide may be present however less than 1 mole %. The silver halide may also contain small amounts of iodide e.g. upto 2%.

Surface image emulsions may be used or internal image emulsions may be used such as those described in U.S. Pat. Nos. 2,592,250, 3,206,313, and 3,447,927. Two or more types of silver halide emulsions that have been prepared differently can be mixed for forming a photographic emulsion layer for use in accordance with the present invention.

The average size of the silver halide grains may range from 0.10 to 0.70 µm, preferably from 0.25 to 0.45 µm.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$. This results in the building in in the silver halide crystal lattice of minor amounts of iridium and/or rhodium, so-called iridium and/or rhodium dopants. As known to those skilled in the art numerous scientific and patent publications disclose the addition of iridium or rhodium containing compounds or compounds containing other elements of Group VIII of the Periodic System during emulsion preparation.

Apart from negative-working silver halide emulsions that are preferred for their high photosensitivity, use can be made also of direct-positive silver halide emulsions that produce a positive silver image in the emulsion layer(s) and a negative image on the lithographic receiving layer. In direct-positive emulsions a non-hardening fogging agent such as stannous chloride and formamidine sulphinic acid can be used.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by a red light emitting source, e.g. a LED or a HeNe laser a red sensitizing dye is used. In case of exposure by an argon ion laser a blue sensizing dye is incorporated. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888. To enhance the sensitivity in the near infra-red region use can be made of so-called supersensitizers in combination with infra-red sensitizing dyes. Suitable supersensitizers are described in Research Disclosure Vol 289, May 1988, item 28952. A preferred green sensitizing dye, red sensitizing dye, blue sensitizing dye, infrared sensitizing dye and supersensitizer are disclosed in U.S. Ser. No. 07/986,071.

The spectral sensitizers can be added to the photographic emulsions in the form of an aqueous solution, a solution in an organic solvent or in the form of a dispersion.

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P 2,453,217.

In an especially preferred embodiment the emulsion layer contains a compound which comprises in its molecular structure a group capable of adsorbing to silver halide and a group capable of reducing silver halide. Compounds of this kind have been disclosed in EP-A-449340. In this way a combination of a stabilizing and a development activating function in one compound is achieved.

More details about the composition, preparation and coating of silver halide emulsions can be found in e.g. Product Licensing Index, Vol. 92, December 1971, publication 9232, p. 107–109.

As an interesting variant the silver halide emulsion may consist of a first photosensitive direct-positive or negative silver halide emulsion in which a normal latent image is formed upon image-wise exposure and a second low-speed silver halide emulsion whose speed is so low that no or almost no latent image is formed therein. When the low-speed silver halide emulsion and the photosensitive silver halide emulsion are coated to form different layers, the resulting emulsion layers are arranged in such a way that the low-speed emulsion is remotest from the lithographic receiving element. It is also possible to coat one single layer comprising a mixture of said photosensitive silver halide emulsion and said low-speed silver halide emulsion.

Thanks to the combination of photosensitive and low-speed emulsions a higher amount of silver can migrate to form the silver image on the physical development nuclei containing layer. As a result, an enhanced contrast and a high resistance against mechanical wear are obtained.

The low-speed silver halide emulsion has a speed which is so low, that substantially no visible image is formed therein under the conditions of exposure and development of the photosensitive silver halide emulsion layer. In as much as the sensitivity of this emulsion must be low, no physical or chemical sensitization thereof is needed. The low-speed emulsion preferably is a fine-grain silver chloride emulsion having a particle size in the range of 50 to 500 nm.

In case a mixture of low-speed emulsion and of imaging emulsion is coated to form one single layer, the amount of low-speed emulsion may vary within wide limits. Favourable results can be obtained when the ratio of low-speed silver chloride-containing emulsion to image-forming emulsion, expressed in parts by weight of silver nitrate, ranges from 10:1 to 1:1.

When separate layers of low-speed emulsion and of imaging emulsion are used, the ratio expressed in parts by weight of silver nitrate of said different layers, also ranges from 10:1 to 1:1.

Preferred meso-ionic compounds for use in connection with the present invention are those represented by formula (I):

$$M^+ A^\ominus \quad (I)$$

wherein M represents a 5- or 6-membered heterocyclic ring composed of at least one member selected from the group consisting of a carbon atom, an oxygen atom, a nitrogen atom, a sulfur atom and a selenium atom: and $A^\ominus$ represents $-O^\ominus$, $-S^\ominus$ or $-N^\ominus-R$, wherein R represents an alkyl group (preferably having 1 to 6 carbon atoms), a cycloalkyl group (preferably having 3 to 6 carbon atoms), an alkenyl group (preferably having 2 to 6 carbon atoms) an alkynyl group (preferably having 2 to 6 carbon atoms), an aralkyl group, an aryl group (preferably having 6 to 12 carbon atoms), or a heterocyclic group (preferably having 1 to 6 carbon atoms).

In formula (I), examples of the 5-membered heterocyclic ring as represented by M include an imidazolium ring, a pyrazolium ring, an oxazolium ring, an isoxazolium ring, a thiazolium ring, an isothiazolium ring, a 1,3-dithiol ring, a 1,3,4- or 1,2,3 oxadiazolium ring, a 1,3,2-oxathiazolium ring, a 1,2,3-triazolium ring, a 1,3,4-triazolium ring, a 1,3,4-, 1,2,3- or 1,2,4-thiadiazolium ring, a 1,2,3,4-oxatriazolium ring, a 1,2,3,4-tetrazolium ring and a 1,2,3,4-thiatriazolium ring.

Preferred meso-ionic compounds for use in accordance with the present invention are triazolium thiolates and more preferably 1,2,4-triazolium-3-thiolates and most preferably those that correspond to the following formula:

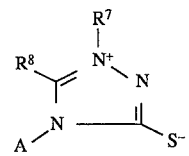

wherein $R^7$ and $R^8$ each independently represents a substituted or unsubstituted alkyl group, a substituted or unsubstituted alkenyl group, a substituted or unsubstituted cycloalkyl group, a substituted or unsubstituted aralkyl group, a substituted or unsubstituted aryl group or a substituted or unsubstituted heterocyclic group. A represents a substituted or unsubstituted alkyl group, a substituted or unsubstituted alkenyl group, a substituted or unsubstituted cycloalkyl group, a substituted or unsubstituted aralkyl group, a substituted or unsubstituted aryl group, a substituted or unsubstituted heterocyclic group or $-NR^9R^{10}$ and $R^9$ and $R^{10}$ each independently represents hydrogen, a substituted or unsubstituted alkyl group, a substituted or unsubstituted aryl group or $R^7$ and $R^8$ or $R^8$ and A or $R^9$ and $R^{10}$ represent the necessary atoms to form together with the atoms to which they are attached a 5- or 6-membered ring.

Specific examples of 1,2,4-triazolium-3-thiolates suitable for use in accordance with the present invention are shown in table 1.

TABLE I

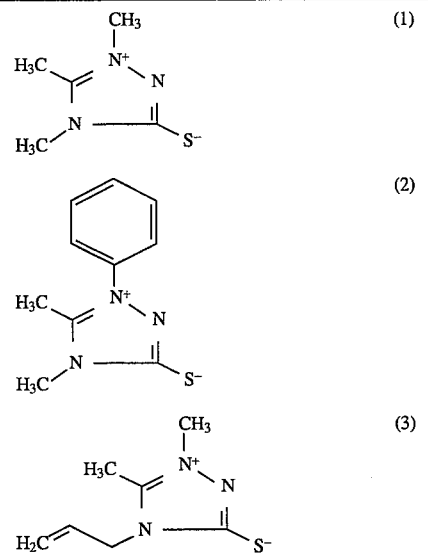

TABLE I-continued

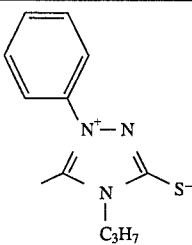

(4)

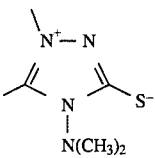

(5)

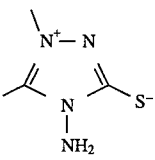

(6)

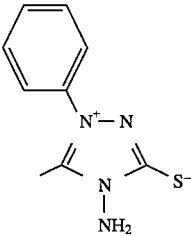

(7)

According to the preferred embodiment of the present invention at least part and most preferably all of the meso-ionic compound is preferably present in the alkaline processing liquid used for developing the image-wise exposed imaging element. Preferably the amount of meso-ionic compound in the alkaline processing liquid is between 0.1 mmol/l and 50 mmol/l and more preferably between 0.1 mmol/l and 25 mmol/l and most preferably between 0.5 mmol/l and 10 mmol/l.

However the meso-ionic compound may be incorporated in one or more layers comprised on the support of the imaging element. This offers the advantage of replenishment of said meso-ionic compound in the alkaline processing liquid. Preferably the meso-ionic compound is incorporated in a layer of the imaging element that does not contain silver halide such as e.g. in a backing layer, in the image receiving layer, a subbing layer etc. The meso-ionic compound is preferably contained in the imaging element in a total amount between 0.1 and 10 mmol/m$^2$, more preferably between 0.1 and 5 mmol/m$^2$ and most preferably between 0.5 and 1.5 mmol/m$^2$.

According to the present invention the alkaline processing liquid used for developing the imaging element preferably contains a further silver halide solvent although this is no absolute requirement since meso-ionic compounds can be used as the sole silver halide solvent. Preferably the silver halide solvent is used in an amount between 0.05% by weight and 10% by weight and more preferably between 0.05% by weight and 7% by weight. Suitable silver halide solvents for use in connection with the present invention are e.g. 2-mercaptobenzoic acid, cyclic imides, oxazolidones, thiocyanates, thiosulfates and the compounds disclosed in U.S. Ser. No. 07/810,146. Further silver halide solvents that can be used in connection with the present invention are alkanolamines. Alkanolamines that are suitable for use in accordance with the present invention may be of the tertiary, secundary or primary type. Examples of alkanolamines that may be used in connection with the present invention correspond to the following formula:

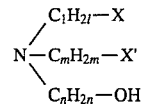

wherein X and X' independently represent hydrogen, a hydroxyl group or an amino group, 1 and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

According to the present invention the alkanolamines are preferably present in the alkaline processing liquid in a concentration preferably between 0.05% and 10% by weight. However part or all of the alkanolamine can be present in one or more layers of the imaging element.

Especially good results are obtained when a meso-ionic compound, preferably a triazolium thiolate, is used in combination with a thioether as silver halide solvent. The best results are obtained when a combination of a meso-ionic compound, a thioether and/or an alkanolamine are used as silver halide solvents. Preferably used thioethers correspond to the following general formula:

$$Z-(R^1-S)_t-R^2-S-R^3-Y$$

wherein Z and Y each independently represents hydrogen, an alkyl group, an amino group, an ammonium group, a hydroxyl, a sulfo group, a carboxyl, an aminocarbonyl or an aminosulfonyl, $R^1$ $R^2$ and $R^3$ each independently represents an alkylene that may be substituted and optionally contain a oxygen bridge and t represents an integer from 0 to 10.

Examples of thioether compounds corresponding to the above formula are disclosed in e.g. U.S. Pat. No. 4,960,683 and U.S. Pat. No. 5,200,294 and specific examples are listed in table 2.

TABLE 2

| | |
|---|---|
| $(HO-CH_2-CH_2)_2S$ | 1 |
| $HO-CH_2-CH_2-S-CH_2-S-CH_2-CH_2-OH$ | 2 |
| $HO-CH_2-CH_2-S-(CH_2)_2-S-CH_2-CH_2-OH$ | 3 |
| $HO-CH_2-CH_2-S-(CH_2)_3-S-CH_2-CH_2-OH$ | 4 |
| $HO-CH_2-CH_2-S-(CH_2)_4-S-CH_2-CH_2-OH$ | 5 |
| $C_2H_5-S-CH_2-CH_2-S-CH_2-CHOH-CH_2-OH$ | 6 |
| $(HOCH_2-CH_2-S-CH_2-CH_2)_2O$ | 7 |
| $HO-CH_2-CH_2-S-CH_2-CH_2-N(CH_3)_2$ | 8 |
| $(HO-CH_2-CHOH-CH_2-S-CH_2)_2$ | 9 |
| $HOOC-CH_2-S-CH_2-S-CH_2-COOH$ | 10 |
| $HOOC-CH_2-S-(CH_2)_2-S-CH_2-COOH$ | 11 |
| $HOOC-CH_2-S-(CH_2)_3-S-CH_2-COOH$ | 12 |
| $HOOC-(CH_2)_2-S-CH_2-S-(CH_2)_2-COOH$ | 13 |
| $HOOC-(CH_2)_2-S-(CH_2)_2-S-(CH_2)_2-COOH$ | 14 |
| $HOOC-(CH_2)_2-S-(CH_2)_3-S-(CH_2)_2-COOH$ | 15 |
| $CH_3-S-CH_2-CH_2-\underset{\underset{NH_2}{\vert}}{CH}-COOH$ | 16 |

According to the present invention the alkaline processing liquid preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728, and U.S. Pat. No. 4,563,410. Particularly preferred hydrophobizing agents in connection with the present invention are long chain (at least 5 carbon atoms) alkyl substituted mercaptotetrazoles, more in particular those according to the following formula (II):

wherein Z represents a substituted or unsubstituted alkyl, a substituted or unsubstituted aryl, a substituted or unsubstituted aralkyl, a substituted or unsubstituted alkylaryl, a substituted or unsubstituted alkenyl, a substituted or unsubstituted alkynyl or a heterocyclic ring.

Specific examples of hydrophobizing agents according to formula (II) are listed in table 3.

TABLE 3

| compound no. | Z in formula (II) |
|---|---|
| 1 | $CH_2CONH\text{-}n.C_6H_{13}$ |
| 2 | $CH_2CON(n.C_4H_9)_2$ |
| 3 | $C_6H_{13}$ |

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The alkaline processing liquid used in accordance with the present invention preferably has a pH between 9 and 11.5 and more preferably between 10 and 11.5. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

The alkaline processing liquid may also contain the developing agent(s) used in accordance with the present invention. In this case the alkaline processing liquid is called a developer. On the other hand some or all of the developing agent(s) may be present in one or more layers of the imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. Preferred phenidone type developing agents, particularly when they are incorporated into the photographic material are phenidones of which the aqueous solubility is increased by a hydrophilic substituent such as e.g. hydroxy, amino, carboxylic acid group, sulphonic acid group etc. Examples of phenidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used.

At least the auxiliary developing agents are preferably incorporated into the photographic material. The auxiliary developing agent is preferably incorporated in the photographic material, preferably in the silver halide emulsion layer of the photographic material, in an amount between 50 mg/g and 1000 mg/g of silver halide expressed as $AgNO_3$, more preferably in an amount between 80 mg/g and 800 mg/g of silver halide expressed as $AgNO_3$, most preferably in an amount between 120 mg/g and 600 mg/g of silver halide expressed as $AgNO_3$.

The place and the amount of the auxiliary developing agent(s) is particularly important for the balance between the kinetic of the development reaction of the silver halide cristals in the irradiated areas of the imaging element and the kinetic of the silver complex diffusion transfer in the non-irradiated areas of the imaging element. Said last reaction is of course dependent on the nature of the used silver halide solvents or reagents, i.c. a meso-ionic compound, and thus also the place and amount of auxiliary developing agent is dependent on the used silver halide solvent or reagent to keep the right balance between said two kinetics. A right balance between said two kinetics determines for an important part the properties of the obtained printing plate.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners.

Development acceleration can be accomplished with the aid of various compounds added to the alkaline processing liquid and/or one or more layers of the photographic element, preferably polyalkylene derivatives having a molecular weight of at least 400 such as those described in e.g. U.S. Pat. Nos. 3,038,805; 4,038,075; 4,292,400; 4,975,354.

According to one embodiment of the present invention for obtaining a lithographic printing plate an imaging element comprising in the order given on a support a silver halide emulsion layer in accordance with the present invention and an image receiving layer is image-wise or information-wise exposed and subsequently developed in the presence of a meso-ionic compound using an alkaline processing liquid e.g. as described above.

The development step is preferably followed by a neutralization of the surface of the imaged element by guiding the element through a neutralization liquid having a pH between 4 and 7. The neutralization liquid preferably contains a buffer e.g. a phosphate buffer, a citrate buffer or mixture thereof. The neutralization solution can further contain bactericides, e.g. phenol, thymol or 5-bromo-5-nitro-1,3-dioxan as described in EP 0,150,517. The liquid can also contain substances which influence the hydrophobic/hydrophilic balance of the printing plate obtained after processing of the DTR element, e.g. silica. Further the neutralization solution can contain wetting agents, preferably compounds containing perfluorinated alkyl groups. By adding an inorganic fluoride e.g. NaF in amounts of 80 mg/l or less to the neutralization solution toning of the printing plate can be reduced or avoided. Instead of or in combination with the inorganic fluoride a cationic polymer or a polymer containing amino groups can be added to the neutralization solution for reducing toning of the plate. Specific examples of polymers containing amino groups are e.g. a poly(N-3-(2-aminoethyl)-aminopropylsiloxane) or a dextran comprising a group containing an amino group e.g. Dormacid that is commercially available from Pfeifer & Langen and is the commercial name for a dextran containing diethylaminoethyl groups. These polymers are preferably added to the neutralization solution in amounts of 0.01% to 5% and more preferably in amounts of 0.05% to 1% and most preferably in amounts between 0.05% and 0.5%.

According to the present invention the imaging element can be information-wise exposed in an apparatus according to its particular application, e.g. a conventional process camera containing a conventional light source or a laser containing device.

The imaging element in connection with the present invention for preparing a lithographic printing plate essentially contains on a support a photosensitive layer containing silver halide and an image receiving layer containing physical development nuclei. As described above one of the layers contained on the support of the imaging element may contain a 1,2,4-triazolium-3-thiolate in accordance with the present invention.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly-(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminium may also be used in accordance with the present invention.

Suitable physical development nuclei for use in the receiving layer in accordance with the present invention are sulphides of heavy metals e.g. sulphides of antimony, bismuth, cadmium, cobalt, lead, nickel, palladium, platinum, silver, and zinc. Preferably used are PdS, $Ag_2S$ or AgNiS nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The best results are obtained when the image receiving layer contains physical development nuclei having an average diameter less than 6 nm and wherein the number of nuclei having a diameter larger than 4.5 nm is less than 15% of the total number of nuclei contained in said receiving layer. Although the size of the nuclei above is expressed by a diameter this does not imply that the nuclei are necessarily spherical. By diameter is meant the diameter of a sphere having an equivalent volume so that the size of nuclei of a variety of shapes can be characterized by the same parameter. Further details on these physical development nuclei are disclosed in U.S. Ser. No. 07/979,897.

The image receiving layer containing physical development nuclei used in accordance with the present invention is preferably free of hydrophilic binder but may comprise small amounts upto 30% by weight of the total weight of said layer of a hydrophilic colloid e.g. polyvinyl alcohol to improve the hydrophilicity of the surface.

The amount of nuclei used in the image receiving layer is preferably between 0.02 mg/m$^2$ and 10 mg/m$^2$.

In addition to the above described emulsion layer and image receiving layer other hydrophilic colloid layers in water permeable relationship with these layers may be present. For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the theological properties of the layer. Like the emulsion layer the other hydrophilic layers are coated preferably at a pH value below the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, methylenebis(sulfonylethylene), chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3, 5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides: and cationic agents such as alkylamine salts, aliphatic, aromatic, or heterocyclic quaternary ammonium salts, aliphatic or heterocyclic ring-containing phosphonium or sulphonium salts. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth)acrylates, sulphoalkyl (meth)acrylates, and styrene sulphonic acids.

According to another embodiment of the present invention a lithographic printing plate can be obtained by means of the DTR-process using an imaging element comprising in the order given a support, a layer of physical development nuclei and a silver halide emulsion layer in accordance with the present invention. Preferably a grained and anodized aluminium support is used. The imaging element of the present embodiment may be imaged using a camera-exposure or a scanning exposure as described above followed by a development step in the presence of development agent(s) and silver halide solvent(s) according to the invention so that a silver image is formed in the physical development nuclei layer. Subsequently the silver halide emulsion layer and any other optional hydrophilic layers are removed by rinsing the imaged element with water so that the silver image is exposed. Finally the hydrophobic character of the silver image is preferably improved using a finishing liquid comprising hydrophobizing agents as described above.

The present invention will now be illustrated by the following example without however limiting it thereto. All parts are by weight unless otherwise specified.

EXAMPLE 1

Preparation of the Silver Halide Emulsion Coating Solutions

A silver halide emulsion A composed of 98 mole % of chloride, 1.7 mole % of bromide and 0.3 mole % of iodide was prepared by the double jet precipitation method. The average silver halide grain size was 0.4 μm (diameter of a sphere with equivalent volume) and contained Rhodium ions as internal dopant.

A silver halide emulsion B composed of 99.7 mole % of chloride and 0.3 mole % of iodide was prepared in an analogous way. The average silver halide grain size was 0.38 μm (diameter of a sphere with equivalent volume) and contained Rhodium ions as internal dopant.

The emulsions A and B were orthochromatically sensitized and stabilized by 1-phenyl-5-mercapto-tetrazole.

A base layer coating solution was prepared having the following composition:

| | |
|---|---|
| gelatin | 5.5% |
| carbon black | 0.76% |
| silica particles (5 μm) | 1.6% |

Preparation of the Imaging Elements

Imaging elements 1, respectively 2 were prepared by simultaneously coating the emulsion coating solution A, respectively the emulsion coating solution B and the base layer coating solution by means of the cascade coating technique to a polyethylene terephthalate support provided with a pack of two backing layers such that the base layer coating was coated directly to the side of the support opposite to the side containing said backing layers. The emulsion layers were coated such that the silver halide coverage expressed as $AgNO_3$ was 1.5 $g/m^2$ and the gelatin content was 1.5 $g/m^2$. The emulsion layers further contained 0.15 $g/m^2$ of 1-phenyl-4,4'-dimethyl-3-pyrazolidone and 0.25 $g/m^2$ of hydroquinone. The base layer was coated such that the amount of gelatin in the coated layer was 3 $g/m^2$.

The layer nearest to the support of the backing layer pack contained 0.3 $g/m^2$ of gelatin and 0.5 $g/m^2$ of the antistatic agent co(tetraallyloxyethane/methacrylate/acrylic acid-K-salt) polymer. The second backing layer contained 4 $g/m^2$ of gelatin, 0.15 $g/m^2$ of a matting agent consisting of transparent spherical polymeric beads of 3 micron average diameter according to EP 0080225, 0.05 $g/m^2$ of hardening agent triacrylformal and 0.021 $g/m^2$ of wetting agent $F_{15}C_7$-$COONH_4$.

The thus obtained elements were dried and subjected to a temperature of 40° C. for 5 days and then the emulsion layers were overcoated with a layer containing PdS as physical development nuclei, hydroquinone at 0.4 $g/m^2$ and formaldehyde at 100 $mg/m^2$.

The following processing solutions were prepared:

| Activator | K | L |
|---|---|---|
| sodium carbonate (g) | 10.6 | 10.6 |
| sodium hydrogen carbonate | 8.4 | 8.4 |
| sodium sulphite anh. (g) | 35 | 35 |
| compound 3 of table 1 (mg) | 1000 | 0 |
| 2-Aminoethyl-aminoethanol (ml) | 60 | 0 |
| potassium thiocyanate (g) | 0 | 20 |
| 2-mercapto-5-n.heptyl-oxa-3,4-diazole (mg) | 300 | 300 |
| water to make | 1 l | 1 l |
| pH | 10.9 | 10.9 |

Neutralization solution

| | |
|---|---|
| citric acid | 10 g |
| sodium citrate | 35 g |
| sodium sulphite anh. | 5 g |
| phenol | 50 mg |
| water to make | 1 l |

Dampening solution

| | |
|---|---|
| water | 880 ml |
| citric acid | 6 g |
| boric acid | 8.4 g |
| sodium sulphate anh. | 25 g |
| ethyleneglycol | 100 g |
| colloidal silica | 28 g |

The above described imaging elements 1 and 2 were under identical conditions image-wise exposed and processed with the above described activators, subsequently neutralized at 25° C. with the neutralization solution described above and dried.

After processing a same number of plates of imaging element 1 respectively 2 in the respective activators K and L the printing plates then obtained were mounted on the same offset printing machine (Heidelberg GTO-46) and were printed under identical conditions. The above mentioned dampening solution was used at a 5% concentration for fountain solution, and K+E 125 ink was used. A compressible rubber blanket was used.

TABLE 3

Continuous processing with imaging element 1 and activator K

| $m^2/l$ | Number of acceptable copies |
|---|---|
| 0 | >10,000 |
| 5 | 8,000 |
| 10 | 2,000 |

TABLE 4

Continuous processing with imaging element 1 and activator L

| $m^2/l$ | Number of acceptable copies |
|---|---|
| 0 | 20–30 |
| 5 | 0 |
| 10 | 0 |

TABLE 5

Continuous processing with imaging element 2 and activator K

| $m^2/l$ | Number of acceptable copies |
|---|---|
| 0 | >10,000 |
| 5 | >10,000 |
| 10 | 8,000 |

TABLE 6

Continuous processing with imaging element 2 and activator L

| $m^2/l$ | Number of acceptable copies |
|---|---|
| 0 | 50–100 |
| 5 | 0 |
| 10 | 0 |

Evaluation

The printing endurance is considerably influenced by the exhaustion degree of a processing solution with a pH of 10.9 when using an imaging element wherein 1.7 mole % of the silver halide comprised in the photosensitive layer is silver bromide (see table 3 and 4: printing plates obtained by a comparative method). The printing endurance is also considerably influenced by the exhaustion degree of a processing solution with a pH of 10.9 even when using an imaging element wherein none of the silver halide comprised in the photosensitive layer is silver bromide when the exposed imaging element is processed in the activator L, not containing a meso-ionic compound (see table 6: printing plate obtained by a comparative method). However, there is no discernible influence by the exhaustion degree of the processing solution with a pH of 10.9 when using an imaging element wherein none of the silver halide comprised in the photosensitive layer is silver bromide and the exposed imaging element is processed in the activator K, containing a meso-ionic compound (see table 5: printing plate obtained by a method according to the invention.

I claim:

1. A method for making a lithographic printing plate according to the silver salt diffusion transfer process comprising the steps of image-wise exposing an imaging element comprising on a support a photosensitive layer comprising silver halide emulsion(s) wherein less than 1 mole % of the silver halide is silver bromide and an image receiving layer containing physical development nuclei and developing said imaging element using an alkaline processing liquid with a pH lower than 11.5 in the presence of developing agent(s), a meso-ionic compound and an alkanolamine.

2. A method according to claim 1 wherein said meso-ionic compound is a triazolium thiolate.

3. A method according to claim 2 wherein said triazolium thiolate corresponds to the following formula:

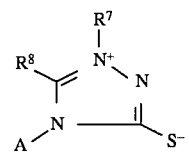

wherein $R^7$ and $R^8$ each independently represents an alkyl group, an alkenyl group, a cycloalkyl group, an aryl group or a heterocyclic group, A represents an alkyl group, an alkenyl group, a cycloalkyl group, an aryl group, a heterocyclic group, or $-NR^9R^{10}$ and $R^9$ and $R^{10}$ each independently represents hydrogen, an alkyl group, an aryl group or $R^7$ and $R^8$ or $R^8$ and A or $R^9$ and $R^{10}$ represent the necessary atoms to form together with the atoms to which they are attached a 5- or 6-membered ring.

4. A method according to claim 1 wherein said meso-ionic compound is present in said alkaline processing liquid.

5. A method according to claim 4 wherein said alkaline processing liquid further comprises a silver halide solvent other than said meso-ionic compound and said alkanolamine.

6. A method according to claim 5 wherein said silver halide solvent is a thioether.

7. A method according to claim 1 wherein said alkaline processing liquid has a pH between 10 and 11.5.

* * * * *